(12) United States Patent
Korsunsky et al.

(10) Patent No.: US 6,688,897 B2
(45) Date of Patent: Feb. 10, 2004

(54) ELECTRICAL CONNECTOR

(75) Inventors: Iosif R. Korsunsky, Harrisburg, PA (US); Kevin E. Walker, Hershey, PA (US); Joanne E. Shipe, Harrisburg, PA (US); Wei-Chen Lee, Harrisburg, PA (US); Tod M. Harlan, Mechanicsburg, PA (US); Robert W. Brown, Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/213,771

(22) Filed: Aug. 6, 2002

(65) Prior Publication Data

US 2003/0171015 A1 Sep. 11, 2003

Related U.S. Application Data

(63) Continuation-in-part of application No. 10/094,499, filed on Mar. 7, 2002, and a continuation-in-part of application No. 10/104,832, filed on Mar. 22, 2002.

(51) Int. Cl.[7] .................................................. H01R 4/66
(52) U.S. Cl. ........................................................ 439/108
(58) Field of Search .......................... 439/79, 108, 101

(56) References Cited

U.S. PATENT DOCUMENTS

| 5,292,265 | A | * | 3/1994 | Chen et al. ................. 439/876 |
|---|---|---|---|---|
| 5,320,541 | A | * | 6/1994 | Korsunsky et al. ........... 439/79 |
| 5,813,871 | A | * | 9/1998 | Grabbe et al. ............... 439/108 |
| 5,823,799 | A | * | 10/1998 | Tor et al. ....................... 439/79 |
| 5,893,764 | A | * | 4/1999 | Long ............................. 439/79 |
| 5,971,775 | A | * | 10/1999 | Tor et al. ....................... 439/79 |
| 6,042,386 | A | * | 3/2000 | Cohen et al. ............... 439/108 |
| 6,152,742 | A | * | 11/2000 | Cohen et al. ............... 439/108 |
| 6,290,515 | B1 | * | 9/2001 | Lee ............................. 439/108 |
| 6,338,635 | B1 | * | 1/2002 | Lee ............................. 439/108 |

* cited by examiner

Primary Examiner—Gary Paumen
(74) Attorney, Agent, or Firm—Wei Te Chung

(57) ABSTRACT

An electrical connector (1) straddle-mounted on an edge (20) of a printed circuit board (2) includes an insulative housing (10) having an elongated groove (11) for mating. A support subassembly (3) is inserted from the opposing side of the housing (10) to expose its portions in the groove (11). The support subassembly (3) includes two bases (30) with attached signal conductors (5) and a U-shaped ground member (4). Two parallel-arranged side portions (40) of the U-shaped ground member (4) are integrally connected via its central portion and each of them is located parallel to a row of signal conductors (5) as their ground reference. The united ground member (4) can be used to establish ground path to the printed circuit board (2) by fewer contacting legs (42) sheared therefrom and help all parts of the support subassembly (3) to be installed in the connector housing (10) at one time.

15 Claims, 8 Drawing Sheets

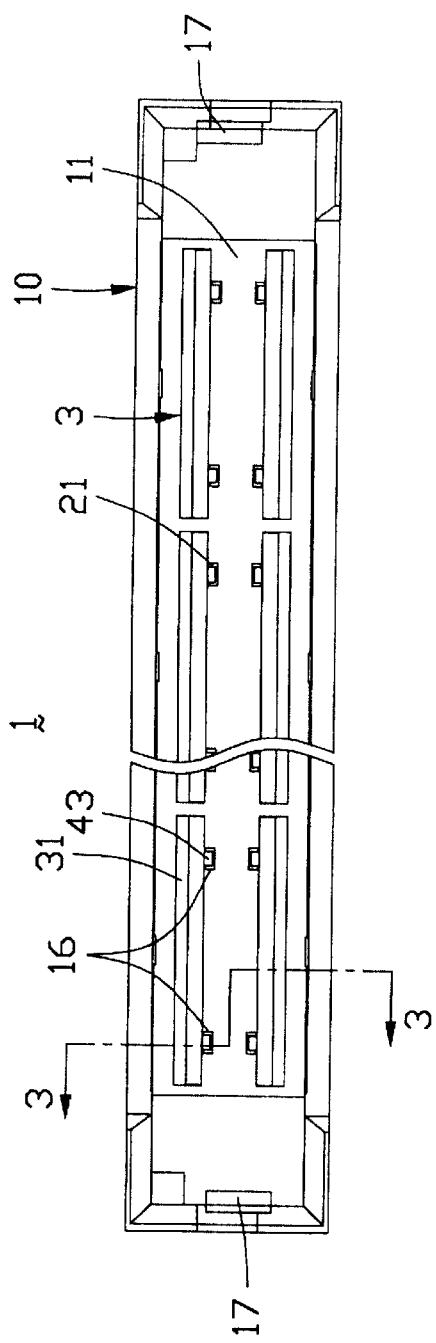
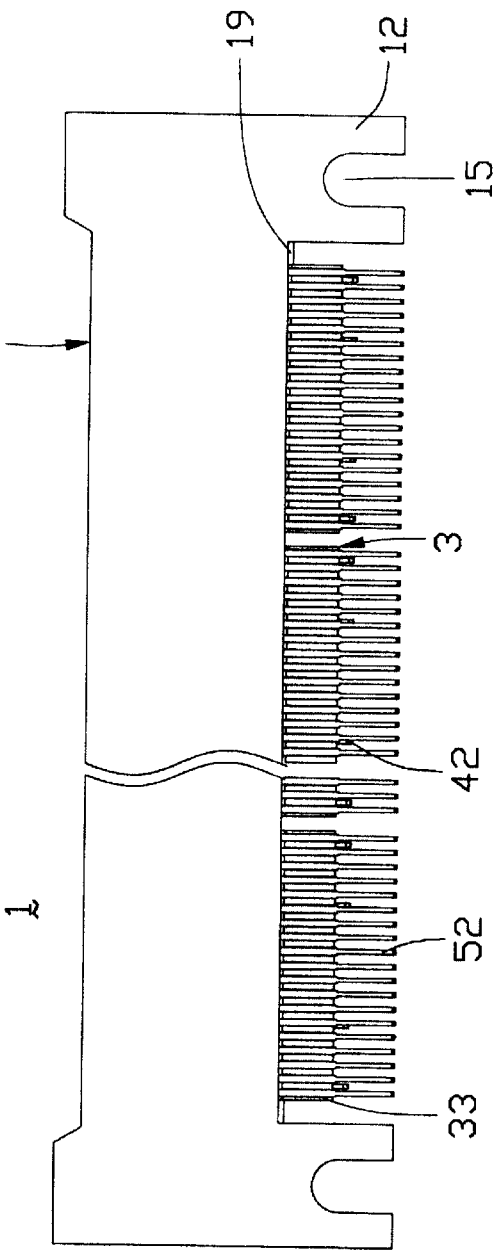
FIG. 1
FIG. 2

ELECTRICAL CONNECTOR

CROSS REFERENCE TO RELATED APPLICATIONS

This application is a continuation-in-part (CIP) of U.S. patent application Ser. No. 10/094,499, filed on Mar. 7, 2002, entitled "PRINTED CIRCUIT BOARD FOR STRADDLE MOUNT ELECTRICAL CONNECTOR AND METHOD FOR PASTING THE SAME", and U.S. patent application Ser. No. 10/104,832, entitled "ELECTRICAL CONNECTOR", filed on Mar. 22, 2002, both being assigned to the same assignee of this patent application. The disclosure of the above identified applications is incorporated herein by reference.

BACKGROUND OF THE INVENTION

1. Field of the Invention

The present invention is related to an electrical connector, especially to a straddle connector which is straddle-mounted on an edge of a printed circuit board and has a common ground member for rows of signal conductors installed inside this connector to connect with the pads disposed at either one or both sides of the printed circuit board.

2. Description of the Related Art

The trend of light, thin and small design for electronic products is prevailing today. The parts used in these products are size-reduced and always rearranged for installation. Thus, the primary circuit board of these electronic products, a main functioning part in these electronic products, gets less available space to connect to other peripheral devices like CD-ROM, hard disk, etc. Therefore, some special connections contributing to space saving, like a straddle mount connector being able to reduce the final height of the assembled primary circuit board, are broadly used. A straddle mount connector is mounted on the edge of the primary circuit board and its contacts are soldered on pads formed on one of two sides of the primary circuit board. Chen et al. U.S. Pat. No. 5,292,265 and Long U.S. Pat. No. 5,893,764 both introduce connectors having two rows of contacts where contacts of one row are engaged on one side of the printed circuit board while contacts of the other row are engaged on the opposite side. A curved tail of every contact is disposed for engaging with the corresponding pad mounted on the printed circuit board due to the difference between the thickness of the printed circuit board and the distance of the two contact rows.

Tor et al. U.S. Pat. Nos. 5,823,799 and 5,971,775 show all the contacts are soldered onto only one side of the printed circuit board, no matter how many rows of contacts the connector has. This type of contact tail arrangement is more easily made and protected because it avoids potential collision in the mounting process. But the space on the edge side of printed circuit board is still limited, which results in the corresponding soldering pads on the printed circuit board being so close to each other that the soldering process is complicated.

However, high density connectors with multi rows of contacts have been introduced to meet the need of high speed transmission recently. Schmidgall et al. European Patent Application No. 01 126552 shows a connector with three rows of contacts which is straddle mounted on a printed circuit board by soldering two rows of contacts on the same side of the printed circuit board and one row of contacts on the other side. The row of contacts that is farther from the edge surface of the printed circuit board than others needs longer and specially bent tails to be engaged with the printed circuit board.

Additionally, crosstalk is usually a concern in high density connectors, especially for high speed transmission. Ground means is then added to surround contacts and shield them from each other for higher electrical performance. Cohen et al. U.S. Pat. No. 6,152,742 and Grabbe et al. U.S. Pat. Nos. 5,320,541 and 5,813,871 all introduce a straddle mount connector having a ground plate disposed between two rows of contacts. The ground plate has tails extending near the tails of the contacts and are soldered onto the same edge of the printed circuit board to establish electrically grounded paths. Obviously, there are more tails, including signal and ground ones, than previously needed to connect with the printed circuit board. Therefore, to solve this space problem in Grabbe design, specialized holes on the edge of the printed circuit board are added which need additional work on the circuit board and cost expensive. This also adds extra insertion force when the connector is mounted onto the circuit board.

In high speed transmission, more than one means of ground in a parallel arrangement are possibly adopted in a high density connector design. It will become an important issue to solve the connection of the ground means to the printed circuit board where the connector is installed.

SUMMARY OF THE INVENTION

Therefore, an object of the present invention is to provide a straddle mount connector having a common ground member installed near signal conductors in the connector for ground reference, and the common ground member of the connector becomes a main connecting part of a integral conductor subassembly so that all the conductors of the connector, including signal conductors and the ground member, can be installed into the connector housing at one time for process simplification and time savings.

Another object of the present invention is to provide a straddle mount connector having a joined ground member with at least two main portions installed near different signal conductors, so that the ground path can still be established for every main portion of the ground member using fewer tails in common to electrically connect to the printed circuit board where the connector is seated, leaving the mounting space on the printed circuit board for other necessary components.

Another object of the present invention is to provide a straddle mount connector having a common ground member for at least two different rows of signal conductors and the ground member of the connector provides mounting tails sheared therefrom to be alternately mounted on two sides of the mounting edge of the printed circuit board where the connector is seated, so that the shearing location of the mounting tails can easily vary to meet the different thickness of the circuit board and the force provided by the mounting tails is large enough to help the connector remain fixedly mounted on the edge of the printed circuit board.

To obtain the above objects, an electrical connector straddle-mounted on an edge of a printed circuit board includes an insulative housing having an elongated groove for mating. A plurality of receiving channels formed adjacently to and communicated with the mating groove are arranged in two rows so that a support subassembly can be inserted and expose its portions in the mating groove. The support subassembly includes two bases each having a plurality of parallel-arranged passageways formed on one surface and protrusions formed on the other. Pin-like signal conductors are inserted into the passageways respectively along the surface of the base and a U-shaped ground member is installed abutting against the other surfaces of two bases of the support subassembly. Each signal conductor includes an engaging end exposed to the mating groove once the signal conductor is inserted into the housing accompanying the support subassembly, and a tail end extending out of the receiving channel in a suspended status. The ground member includes a plurality of contacting legs sheared from the ground member and extending for a predetermined distance to be suspended similar to the tail end of the signal conductors.

Specifically, two parallel-arranged side portions of the U-shaped ground member are integrally connected via the central portion of the ground member, and each of them is installed with one base having signal conductors disposed thereon so that the side portion can be used as ground reference for the signal conductors to reduce unnecessary noise. The support subassembly, united by the ground member, then can be installed into the connector housing at one time to save assembly process and work time. Additionally, the electrically connected side portions of the ground member can share ground paths so that the engaging tails extending from the ground member to the printed circuit board can be reduced to save the occupied space of the connector on the printed circuit board.

Furthermore, the contacting legs of the ground member are sheared from the central portion of the ground member in a row of inversely and alternately arrangement, so that they can extend out of the ground member when two side portions are bent vertically to shape the ground member. The contacting legs are alternately mounted on two sides of the mounting edge of the printed circuit board where the connector is seated to provide the larger holding force for the connector on the printed circuit board before further soldering proceeds. The shearing location of the contacting legs can easily vary to meet the different thickness of the circuit board without newly added material.

Other objects, advantages and novel features of the invention will become more apparent from the following detailed description of the present embodiment when taken in conjunction with the accompanying drawings.

BRIEF DESCRIPTION OF THE DRAWINGS

FIG. 1 is a mating side plan view of an electrical connector in accordance with the present invention;

FIG. 2 is a lengthwise side plan view of the electrical connector in accordance with the present invention;

DESCRIPTION OF THE PREFERRED EMBODIMENT

Figure 3:
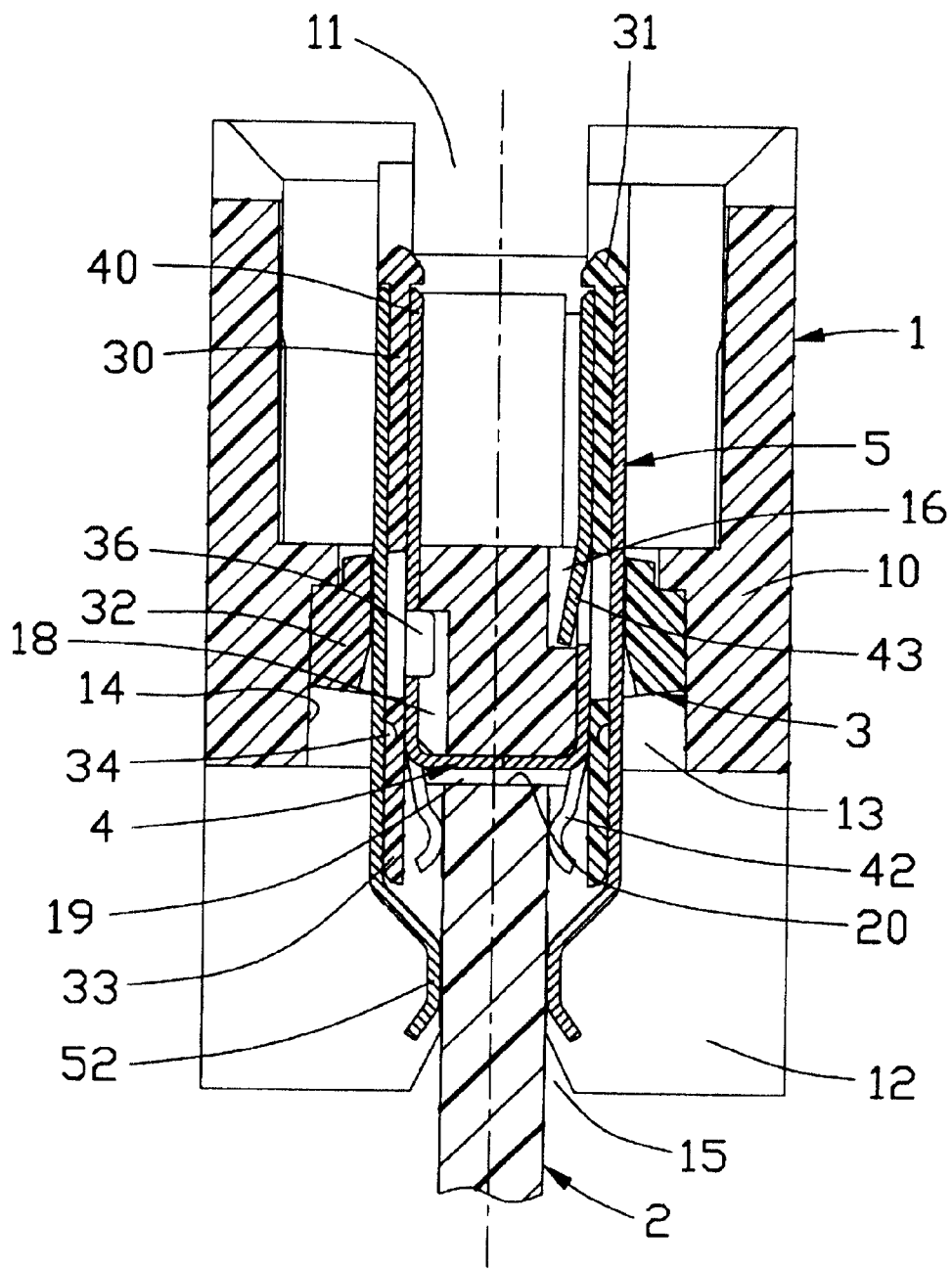
FIG. 3 is a sectional view of the electrical connector along the 3—3 line in FIG. 1 and showing the electrical connector straddle mounted on a printed circuit board.

Referring to FIGS. 1 to 3, the present invention is related to an electrical connector 1 which is straddle-mounted on an edge 20 of a printed circuit board 2. The connector 1 includes an insulative housing 10 having a mating elongated groove 11 extending along one side face of the housing 10. A plurality of receiving channels 13 formed adjacently to and communicated with the mating groove 11 each has an opening formed on another side face opposing to the side face having the groove 11 and extending along the lengthwise direction of the opposing side face in one of two predetermined parallel rows. One inner sidewall 14 of every receiving channel 13 is sloped from it corresponding opening on the opposite side face of the housing 10 to the neighborhood of the mating groove 11. On the central portion of the housing 10 formed between every two adjacent receiving channels 13 of these two channel rows, several recesses 16 are formed on edges abutting both of the groove 11 and any one of the receiving channel 13 to be communicated with them at the same time. And several notches 18 are formed on the opposite side face of the central portion of the housing 10 away from the groove 11 and partially communicated with its nearby receiving channel 13. A mounting portion 12 perpendicularly extending from the opposing side face at both distal ends of the housing 10 for a predetermined distance has a slot 15 formed parallel to the groove 11 so that the edge 20 of the printed circuit board 2 can be received therein. A standoff 19 protruding on the opposite side face and next to each mounting portion 12 is used to stop excess insertion of the edge 20 of the printed circuit board 2 into the slot 15. Meanwhile, a metal anchoring member (not shown) installed in a slit 17 formed in every one of two distal ends of the housing 10 has a fork-shaped tail extending outside of the slit 17 and exposing its portions in the corresponding slot 15. The fork-shaped tail of the anchoring member can then yieldably engage with the edge 20 of the printed circuit board 2 when the edge 20 is inserted into the slot 15.

Referring to FIGS. 3 to 6, a support subassembly 3 with at least two kinds of conductors, signal and ground ones, is inserted into and fixed in two neighboring receiving channels 13 of two different row from their corresponding opening on the opposing side face of the housing 10. The support subassembly 3 includes two reversely arranged, identical plane-like molded bases 30 having a lead-in edge portion 31 formed on one side edge of each base 30 and a separating portion 33 formed on the opposite side edge of the base 30. A bar portion 32 transversely protruding from the middle part of one surface of the base 30 along its lengthwise direction. And a trough portion 34 parallel to the bar portion 32 and abutting against the separating portion 33 is used to adjust the final position of the separating portion 33. A plurality of parallel arranged passageways 35 are formed on the same surface of the base 30 where the bar portion 32 protrudes and each of them passes through and underneath the bar portion 32. A couple of protrusions 36 are formed on the other surface of the base 30 and each extends inversely at the back of the bar portion 32. Meanwhile, pin-like signal conductors 5, one kind of conductor, with the same number as passageways 35 are inserted into the passageways 35 respectively along the surface of each base 30 from its separating portion 33 side to its lead-in edge portion 31 side. These signal conductors 5 can be held below the bar portion 32 and fixed in the corresponding passageways 35 by their own barbs formed on these signal conductors 5. An engaging end 51 formed at one end of every signal conductor 5 stays in its corresponding passageway 35 and is exposed to the mating groove 11 when the signal conductor 5 is inserted into the housing 10 accompanying the support subassembly 3. And a tail end 52 formed at the other end of every signal conductor 5 is then extending out of the receiving channel 13 of the housing 10 and aligning with each other between the mounting portions 12 of the housing 10.

Figure 4:
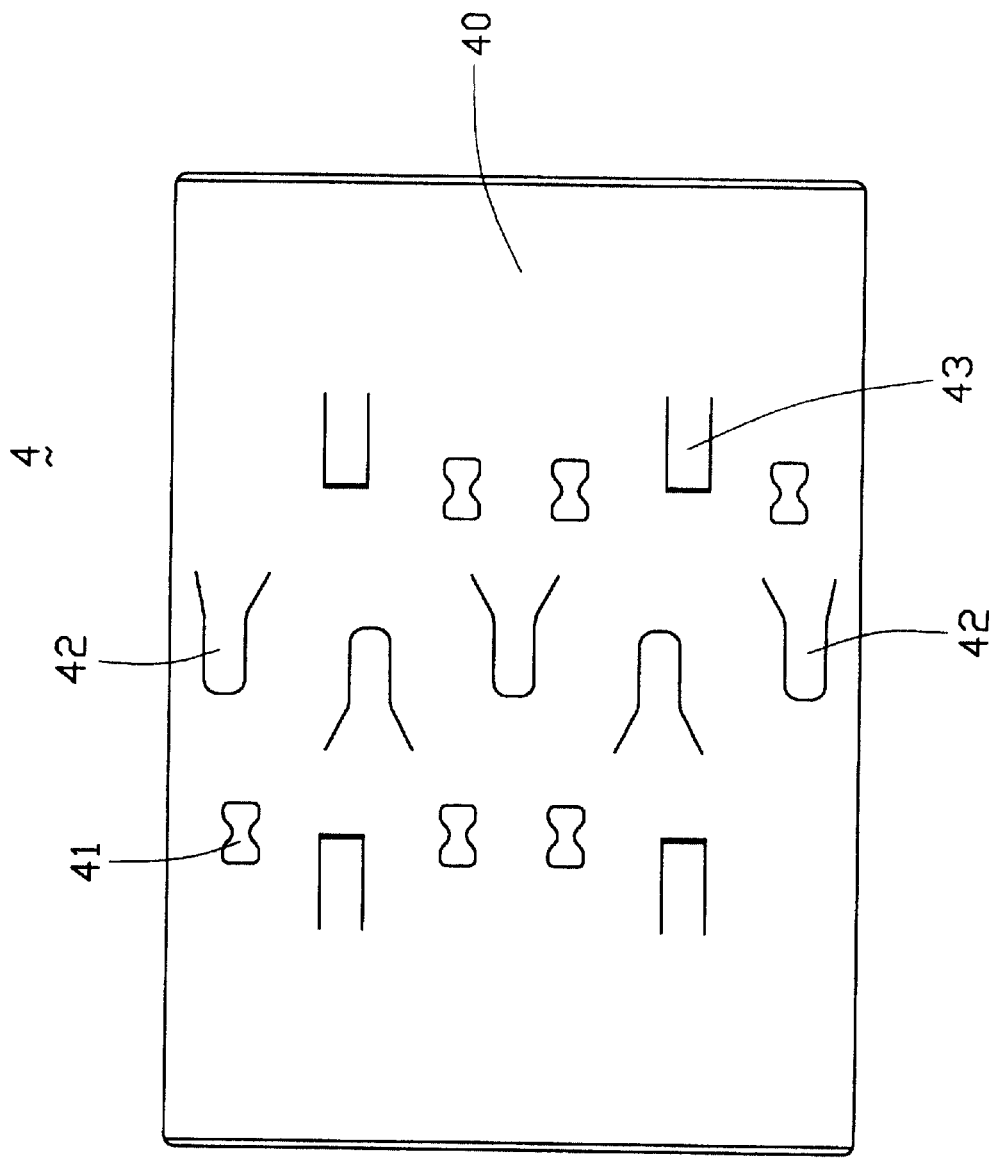
FIG. 4 is a extension plan view of a common ground member used in the electrical connector in accordance with the present invention.
Figure 5:
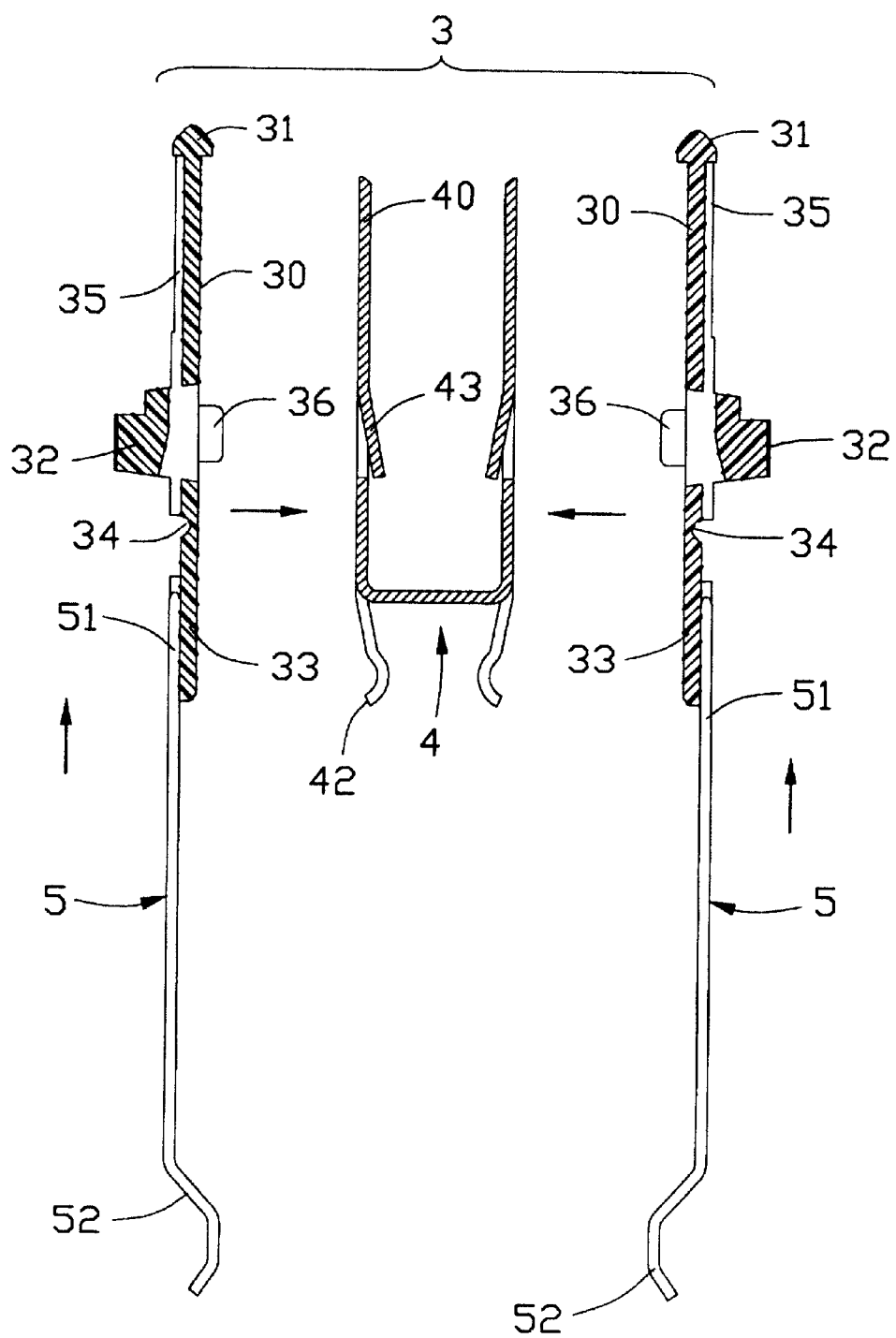
FIG. 5 is a schematic sectional view of a support subassembly of the electrical connector in accordance with the present invention showing the assembly method of the signal conductors and the ground member.

Referring to FIGS. 4 and 5, a ground member 4, used as the other kind of conductor of the support subassembly 3, is formed from a piece of metal plate. Two side portions 40 located at two opposite sides of the metal plate respectively are vertically bent relative to the central portion of the metal plate so that they are in a parallel relationship and the originally flat metal plate becomes a U shape ground member 4. A plurality of contacting legs 42 are sheared from the central portion of the metal plate and every two neighboring contacting legs 42 are reversally and alternately arranged in one row so that portions of them can connect to different side portions 40. And when the side portions 40 are bent vertically to the central portion of the metal plate, the contacting legs 42 connected thereto respectively extend out of and vertically to the central portion to become two parallel rows. A couple of holes 41 with two opposing projections extending and pointing inward from their rims respectively are formed in the central area of two side portions 40 of the ground member 4 corresponding to protrusions 36 of the base 30 so that they can fix the ground member 4 onto the base 30 by clasping their corresponding protrusions 36 therein. In the neighborhood of the holes 41 of every side portion 40, at least one of tab 43 is sheared from a predetermined location of the central area of two side portions 40 of the ground member 4 and extends laterally in a predetermined length along the similar extending direction of the contacting legs 42.

Figure 6:
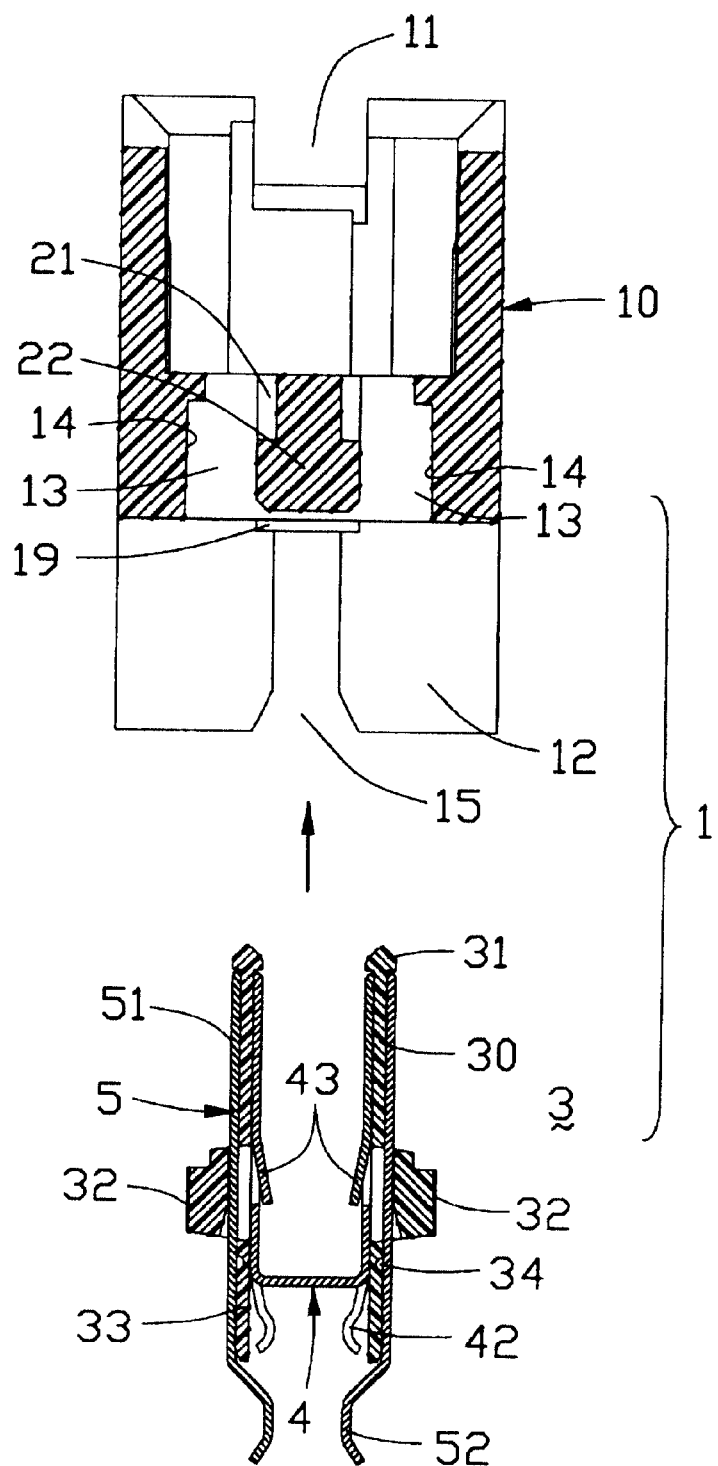
FIG. 6 is a schematic sectional view of the electrical connector in accordance with the present invention showing the assembling method of the support subassembly into the connector housing.

Referring to FIGS. 3, 5 and 6, while assembling, signal conductors 5 are first inserted into their corresponding passageways 35 respectively along the surface of the base 30 and fixed there. And then two inversely arranged bases 30 are placed against two side portions 40 of the ground member 4 respectively by latching holes 41 of every side portion on their protrusions 36 to form a complete support subassembly 3. The ground member 4 is electrically insulated from the signal conductors 5 with these two bases 30 including the suspended contacting leg 42 which is isolated from its neighboring tail ends 52 of signal conductors 5 by any of the separating portions 33 of the bases 30. Then the support subassembly 3 is inserted into the housing 10 from the corresponding openings of two neighboring receiving channels 13. At the very beginning of insertion of the support subassembly 3, the bar portions 32 of two bases 30 are respectively engaged upon the sidewalls 14 of receiving channels 13 while the tabs 43 of the ground member 4 are engaged with and slide along the surface of the central portion of the housing 10 opposite to the sidewall 14. Due to the sloped surface of the sidewall 14, the support subassembly 3 is pushed toward the opposite surface and tabs 44 are pressed toward the base 30 until the bar portions 32 are stopped at the end of the sidewall 14 and tabs 44 reach the corresponding recesses 16 of the central portion of the housing 10 to latch therein.- Simultaneously every protrusion 36 on the bases 30 is received in and moved along its corresponding notch 18 formed on the central portion of the housing 10 till they are stopped at the end of this notch 18. Surely the central portion of the ground member 4 will move close to and finally against the opposite side face of the housing 10. Two side portions 40 of the ground member 4 and engaging ends 51 of signal conductors 5 are then inserted along with the support subassembly 3 into the mating groove 11 and exposed therein as parts of the mating interface. At the same time, contacting legs 42 of the ground member 4 and tail ends 52 of signal conductors 5 all extend outside of the housing 10 and their free ends used for electrical engagement are arranged in different rows parallel to the housing 10 respectively. The separating portion 33 of every base 30 extends outside of the housing 10 to separate the contacting legs 42 from the tail ends 52. It is understood the contacting legs 42 and the tail ends 52 will be used to engage with two corresponding rows of contacting pads (not labeled) disposed near the edge 20 of the printed circuit board 2.

Figure 7:
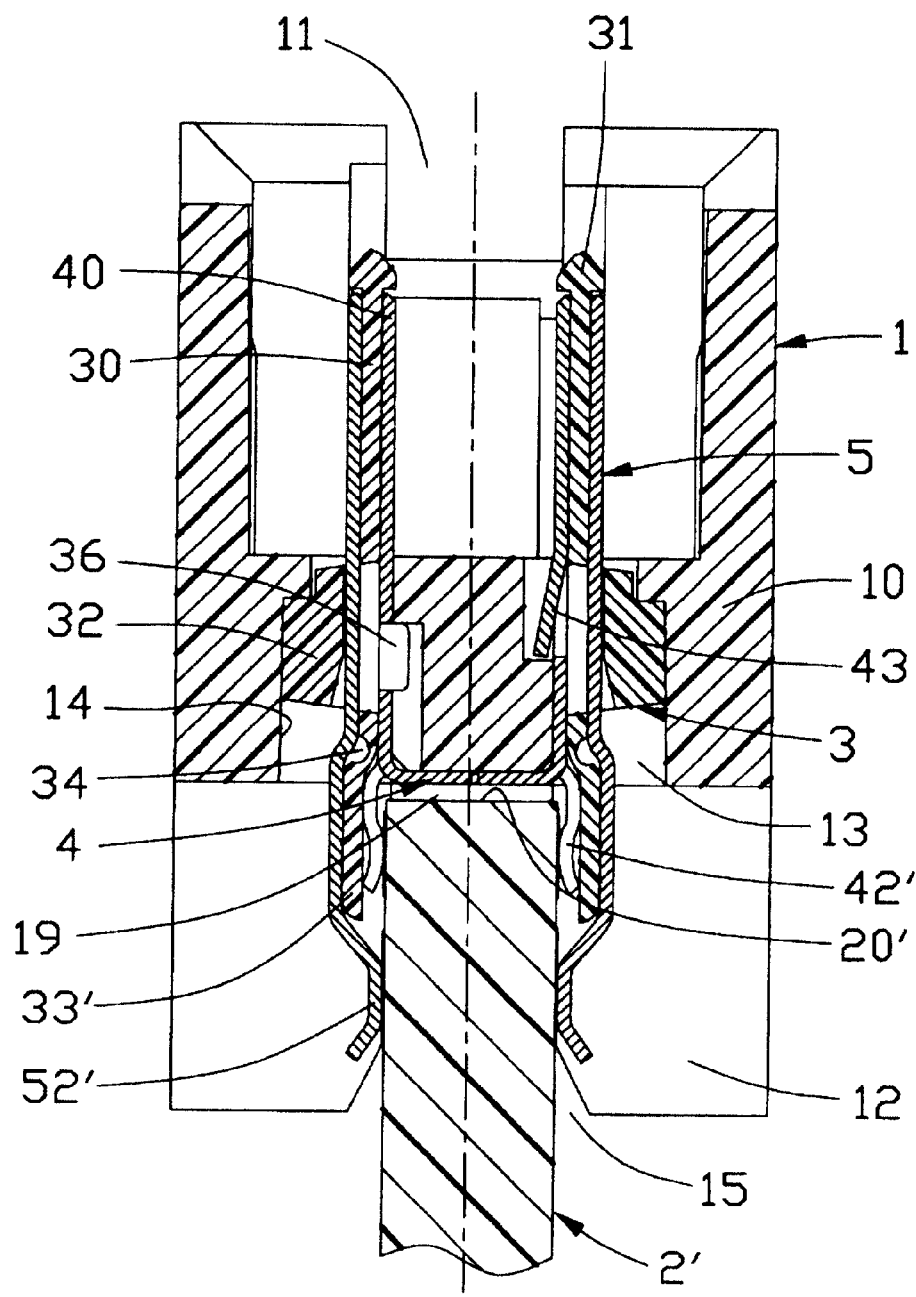
FIG. 7 is a sectional view of the electrical connector in accordance with the present invention showing the electrical connector straddle mounted on a printed circuit board which is thicker than the printed circuit board shown in FIG. 3.

Referring to FIG. 7, a second embodiment for the electrical connector 1 in accordance with the present invention is shown to be straddle-mounted on an edge 20' of another printed circuit board 2' which has a larger board thickness. The shifting of engaging positions on this printed circuit board 2' causes corresponding shape changes of the tail end 52' of every signal conductor 5 and contacting legs 42' of the ground member 4 in order to be smoothly straddle mounted on the thicker printed circuit board 2'. The distance between two opposite tail ends 52' or contacting legs 42' is added in order to gain more space for the insertion of the printed circuit board 2' while most mating portions of the support subassembly 3 in the mating groove 11 remain the same. Therefore, the separating portion 33' partitioning between one row of tail ends 52' of signal conductors 5 and contacting legs 42' of the ground member 4 is moved farther away from the other separating portion 33' of the support subassembly 3 to stay at a newly offset position between the tail ends 52' and contacting legs 42'.

Figure 8:
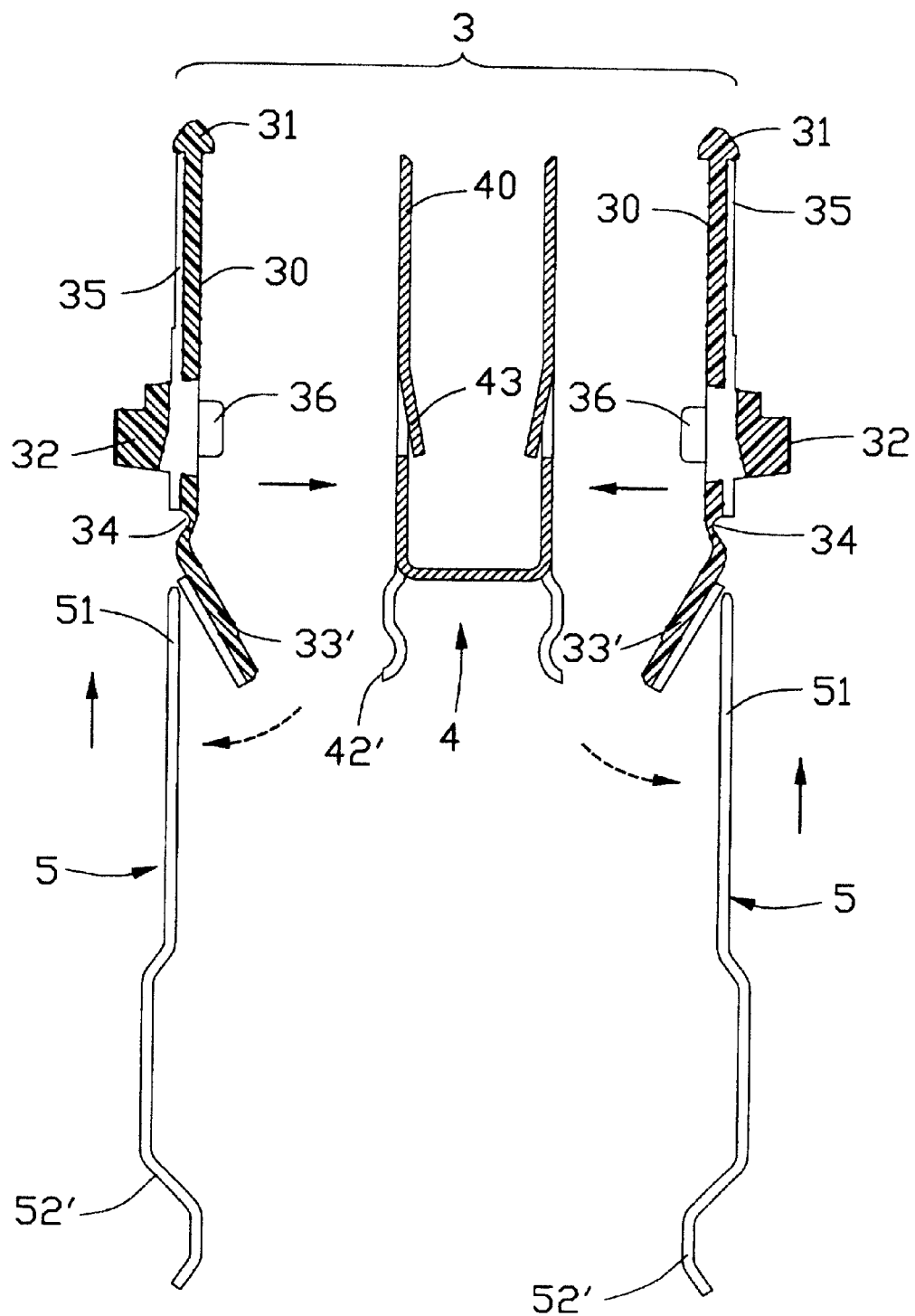
FIG. 8 is a schematic sectional view of a support subassembly of the electrical connector to be straddle mounted on the thicker printed circuit board shown in FIG. 7 and showing the assembly method of the signal conductors and the ground member.
Figure 9:
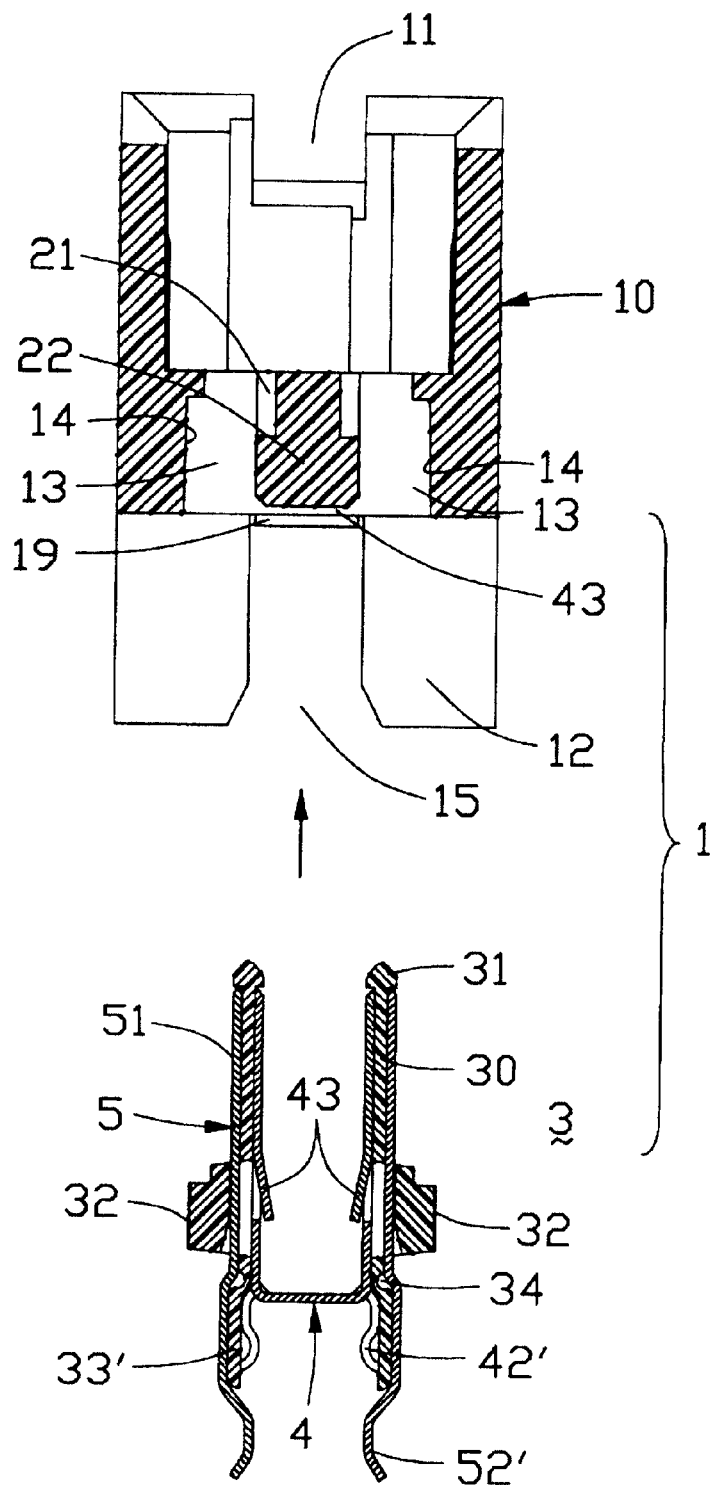
FIG. 9 is a schematic sectional view of the electrical connector to be straddle mounted on the thicker printed circuit board shown in FIG. 7 and showing the assembling method of the support subassembly into the connector housing.

Referring to FIGS. 8 and 9, in this embodiment, the assembly process of the support subassembly 3 is changed because the offset separating portion 33' blocks the insertion entrance of every passageway 35 for its corresponding signal conductors 5. However, the strength-weaken trough portion 34 is bent to move the offset separating portion 33 away from the insertion entrance so that signal conductors 5 can be inserted into their corresponding passageways 35 respectively. And then the separating portion 33 is moved back to its original and desired position before the ground member 4 is placed on the other surface of every base 30 to form a complete support subassembly 3. The separating portion 33 can still stay between tail ends 52' of signal conductors 5 and contacting legs 42' of the ground member 4 in order to function as an isolator therebetween. The support subassembly 3 is then inserted into the housing 10 from their corresponding openings of the receiving channels 13 to finish the assembling processes of the connector 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector straddle mounted on a printed circuit board comprising:
   a housing being adapted to mate with a mating connector;
   at least two groups of signal conductors being installed in the housing with plastic parts and each signal conductor extending throughout the housing to engage with the mating connector and printed circuit board respectively; wherein
   at least two ground portions are located near and parallel to every group of the signal conductors respectively, and said ground portions are mechanically and electrically connected so that they are able to be assembled into the housing together and share any possible ground path to the printed circuit board.

2. The electrical connector as recited in claim 1, wherein said ground portions are two parallel parts of an integral U-shaped ground member.

3. The electrical connector as recited in claim 1, wherein each group of signal conductors are installed and arranged in a row on a molded base which is the plastic part they are installed with.

4. The electrical connector as recited in claim 3, wherein a support subassembly is formed by assembling every one of the bases with one of the ground portions.

5. The electrical connector as recited in claim 2, wherein a plurality of contacting legs are sheared from the ground member and extend to engage with the printed circuit board.

6. The electrical connector as recited in claim 1, wherein a joint portion of said two ground portions are sandwiched between a front edge of the printed circuit board and a mounting face of said housing.

7. An electrical connector straddle mounted on a printed circuit board comprising:
   a housing being adapted to mate with a mating connector;
   a support subassembly with at least two groups of signal conductors installed thereon being installed in the housing, said signal conductors of the support subassembly all extending throughout the housing to engage with the mating connector and printed circuit board respectively; wherein
   the support subassembly includes a ground member having portions extending near every group of the signal conductors respectively to keep a parallel-arranged relationship with them, said ground member has a plurality of contacting legs to electrically connect to the printed circuit board so that the portions parallel to the signal conductors are able to ground.

8. The electrical connector as recited in claim 7, wherein said ground member is U-shaped and has parallel side portions located near every group of the signal conductors.

9. The electrical connector as recited in claim 8, wherein each group of signal conductors are installed and arranged in a row on a molded base and each base is fixed with one side portion of said ground member.

10. The electrical connector as recited in claim 7, wherein a plurality of contacting legs are sheared from the ground member and extend to engage with the printed circuit board.

11. An electrical connector straddle mounted on a printed circuit board comprising:
    a housing having a mating side face of the housing used to mate with a mating connector and a mounting side face opposing to the mating side face confronting one edge of the printed circuit board;
    a support subassembly comprising signal conductors and at least one ground member neighboring every signal conductor as ground reference, said ground member having a plurality of contacting legs extending therefrom and beyond the mounting side face of the housing; wherein
    said contacting legs are spaced apart along the lengthwise direction and alternately arranged in two row so that each rows of said contacting legs are to mounted on one surface of the printed circuit board.

12. The electrical connector as recited in claim 11, wherein said contacting legs are sheared from portions of said ground member.

13. The electrical connector as recited in claim 12, wherein said ground member is U-shaped and at least two side portions are parallel arranged to each other and the signal conductors.

14. The electrical connector as recited in claim 13, wherein the signal conductors are installed respectively on two molded bases to become one row and each base is fixed with one side portion of said ground member.

15. The electrical connector as recited in claim 11, wherein a portion of the ground member between said two rows of contacting legs, is located between said edge of the printed circuit board and the mounting face of the housing along a mating direction defined by the mating connector.

* * * * *